(12) United States Patent
Yang et al.

(10) Patent No.: US 10,277,093 B2
(45) Date of Patent: Apr. 30, 2019

(54) POWER TOOL AND CIRCUIT BOARD

(71) Applicant: NANJING CHERVON INDUSTRY CO., LTD., Nanjing (CN)

(72) Inventors: Dezhong Yang, Nanjing (CN); Pingbo Shi, Nanjing (CN); Jifeng Feng, Nanjing (CN)

(73) Assignee: NANJING CHERVON INDUSTRY CO., LTD., Nanjing (CN)

( * ) Notice: Subject to any disclaimer, the term of this patent is extended or adjusted under 35 U.S.C. 154(b) by 555 days.

(21) Appl. No.: 14/994,493

(22) Filed: Jan. 13, 2016

(65) Prior Publication Data

US 2016/0204675 A1   Jul. 14, 2016

(30) Foreign Application Priority Data

Jan. 14, 2015   (CN) .......................... 2015 1 0018098

(51) Int. Cl.
| | | |
|---|---|---|
| *H02K 11/33* | (2016.01) | |
| *H02K 7/14* | (2006.01) | |
| *H05K 3/20* | (2006.01) | |
| *H05K 1/02* | (2006.01) | |

(52) U.S. Cl.
CPC ............ *H02K 7/145* (2013.01); *H02K 11/33* (2016.01); *H05K 3/202* (2013.01); *H05K 1/0263* (2013.01); *H05K 2201/1028* (2013.01); *H05K 2201/10272* (2013.01)

(58) Field of Classification Search
USPC ......................................................... 361/760
See application file for complete search history.

(56) References Cited

U.S. PATENT DOCUMENTS

| | | | | |
|---|---|---|---|---|
| 5,583,730 | A * | 12/1996 | Gershen ................. | H01H 83/02 307/118 |
| 2004/0112616 | A1* | 6/2004 | Broghammer ............ | B25F 5/02 173/217 |
| 2014/0265663 | A1* | 9/2014 | Chamberlin ........... | H02K 15/14 310/59 |
| 2014/0361424 | A1* | 12/2014 | Horio .................... | H02M 7/003 257/704 |

* cited by examiner

*Primary Examiner* — Andargie M Aychillhum
(74) *Attorney, Agent, or Firm* — Greenberg Traurig, LLP

(57) ABSTRACT

A power tool and a printed circuit board for use therewith. The power tool has an electric motor and a power source. The printed circuit board assembly has a main board having a conductive portion, a semiconductor power device, and a conductor attached to the conductive portion. The conductive portion electrically connects to the semiconductor power device and the conductor electrically connects to the conductive portion. When current is flowing through the printed circuit board, the heat and the voltage loss generated by the printed circuit board can be reduced.

16 Claims, 4 Drawing Sheets

POWER TOOL AND CIRCUIT BOARD

This application claims the benefit of CN 201510018098.8, filed on Jan. 4, 2015, the disclosure of which is incorporated herein by reference in its entirety.

FIELD OF THE DISCLOSURE

The present disclosure relates generally to power tools and printed circuit boards.

BACKGROUND OF THE DISCLOSURE

A power tool such as an electric drill has a printed circuit board which is generally disposed in the housing of the power tool. When the current which is flowing through the printed circuit board gets greater, the heat which is generated by the printed circuit board gets greater. In this way, the heat in the housing will quickly increase and may cause the power tool to malfunction.

The statements in this section merely provide background information related to the present disclosure and may not constitute prior art.

SUMMARY

In one aspect of the disclosure, a printed circuit board assembly is provided. The printed circuit board assembly comprises: a main board having a conductive portion and an insulation portion both of which are exposed to a surface of the main board; a semiconductor power device mounted on the main board; and a conductor attached to the conductive portion; wherein the conductive portion electrically connects to the semiconductor power device, and the conductor electrically connects to the conductive portion.

In another aspect of the disclosure, a power tool is also provided. The power tool comprises an electric motor; a power source for providing electrical energy to the electric motor; and a printed circuit board assembly having a main board having a conductive portion, a semiconductor power device mounted on the main board, and a conductor attached to the conductive portion; wherein the conductive portion electrically connects to the semiconductor power device, and the conductor electrically connects to the conductive portion.

Further areas of applicability will become apparent from the description provided herein. It should be understood that the description and specific examples are intended for purposes of illustration only and are not intended to limit the scope of the present disclosure.

Figure 1:
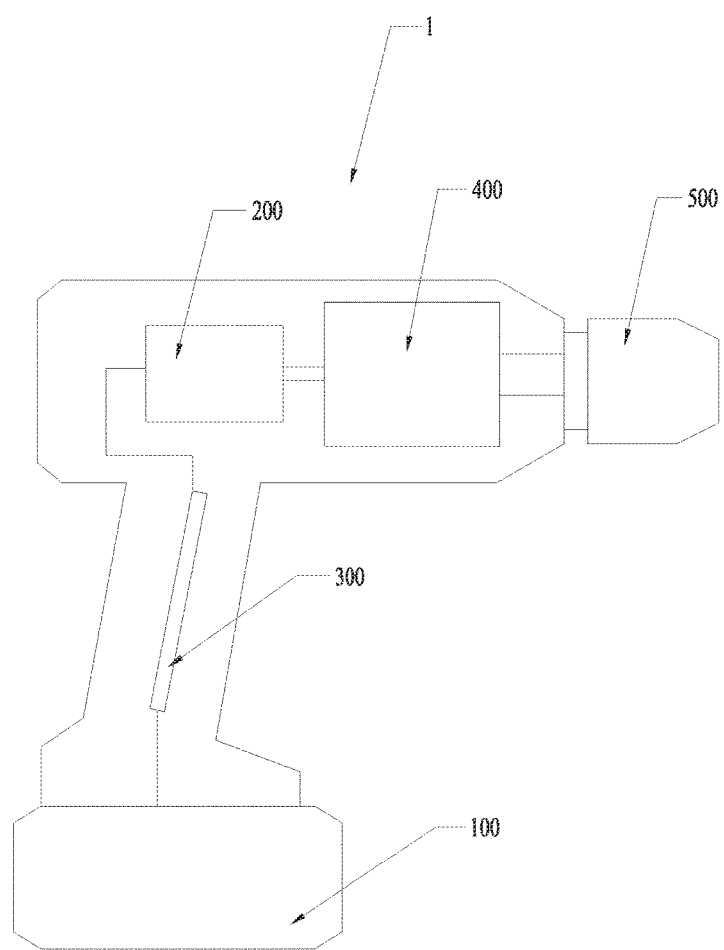
FIG. 1 is a schematic view of an electric drill.

The drawings described herein are for illustrative purposes only of exemplary embodiments and not all possible implementations, and are not intended to limit the scope of the present disclosure. Corresponding reference numerals indicate corresponding parts throughout the several views of the drawings.

DETAILED DESCRIPTION

The following description of the preferred embodiments is merely exemplary in nature and is in no way intended to limit the invention hereinafter claimed, its application, or uses.

As shown in FIG. 1, the electric drill 1 mainly includes a power source 100, an electric motor 200, and a printed circuit board assembly 300.

The electric drill 1 also includes a transmission system 400, a drill head 500, and other conventional components.

The power source 100 is a rechargeable battery pack. In another embodiment, the power source 100 may be an AC-DC transformation device which is capable of transform an alternating current from a power grid to a direct current for powering the motor 200.

The electric motor 200 is electrically connected to the printed circuit board assembly 300. The power source 100 outputs electrical energy to the electric motor 200 by an electrical connection between the electric motor 200 and the printed circuit board assembly 300.

Specifically, the electric motor 200 is a brushless motor.

Referring to FIGS. 1-4, the printed circuit board assembly 300 includes a main board 310, a semiconductor power device 320, and a conductor 330.

The main board 310 is a printed circuit board which at least has a plurality of conductive portions 311-315 and a plurality of insulation portions 331-333 both of which are exposed to a surface 301 of the main board 310.

The conductive portions 311-315 are formed using a conductive material, especially metal materials.

The insulation portions 331-333 are formed using an insulation material.

The conductive portions 311-315 are used to provide electrical connections like a wire.

The insulation portions 331-333 are disposed between the conductive portions and are provided to prevent a current flow through conductive portions which are not connected.

The main board 310, the semiconductor power device 320, and the conductor 330 are connected as a whole body.

The semiconductor power device 320 is mounted on the main board 310. The conductor 330 is attached to the conductive portion 311.

Both the semiconductor power device 320 and the conductor 330 are electrically connected to the conductive portion 311. The semiconductor power device 340 and the conductor 330 are electrically connected to different conductive portions 311 and 312 so the semiconductor power device 340 is not connected to the conductor 330.

Specifically, the conductive portions and the semiconductor power devices constitute a supply circuit between the electric motor and the power source.

The main board 310 has at least two welding terminals 316-317 for connecting to external circuits.

The welding terminal 316 connects to one conductive portion 311 and the welding terminal 317 connects to another conductive portion 313.

The semiconductor power device 320 electrically connects to the conductive portion 311 so as to cause the conductive portion 311 as act as a wire which connects to semiconductor power device 320.

The conductive portion 311 is formed by a conductive layer which is print on the main board 310. For technology reason, the conductive layer is very thin so as to generate a great deal of resistance.

When a current, especially in the circuit between the power source 100 and the electric motor 200, is flowing though the conductive layer of the conductive portion 311; the heat generated by the conductive layer will increase.

Figure 2:
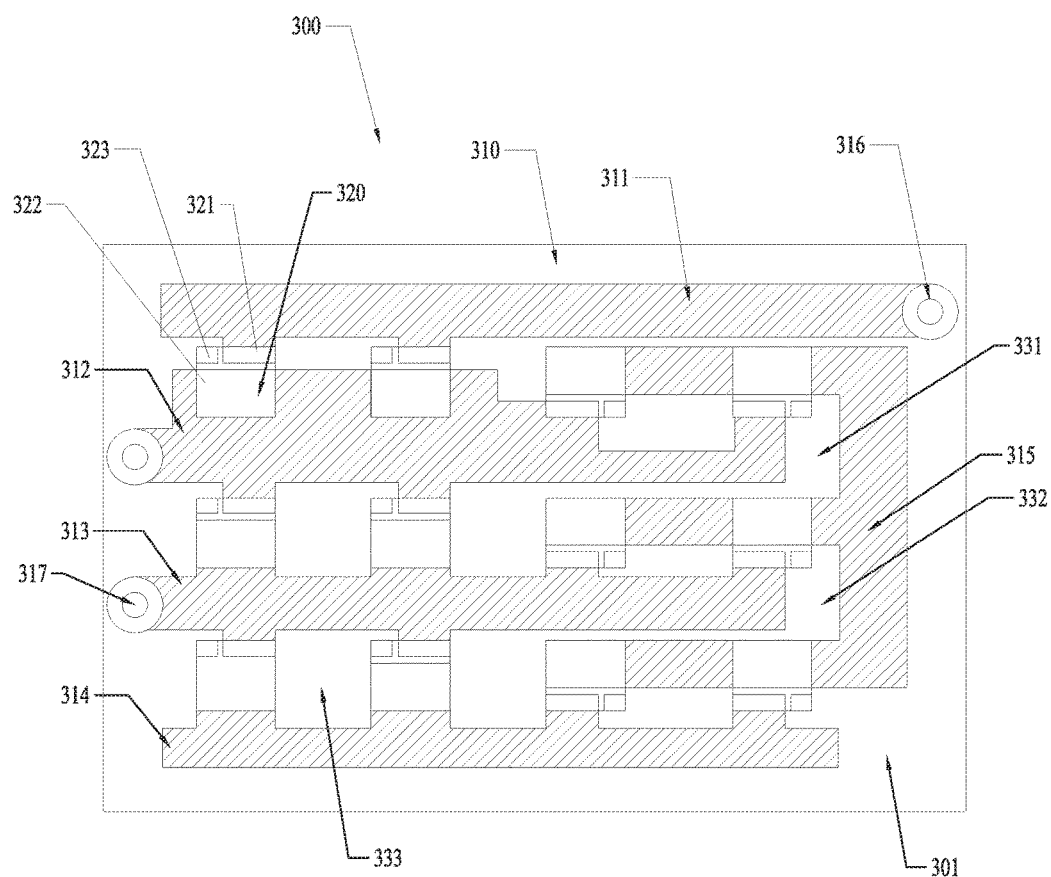
FIG. 2 is a schematic view of an exemplary printed circuit board assembly without conductors.
Figure 3:
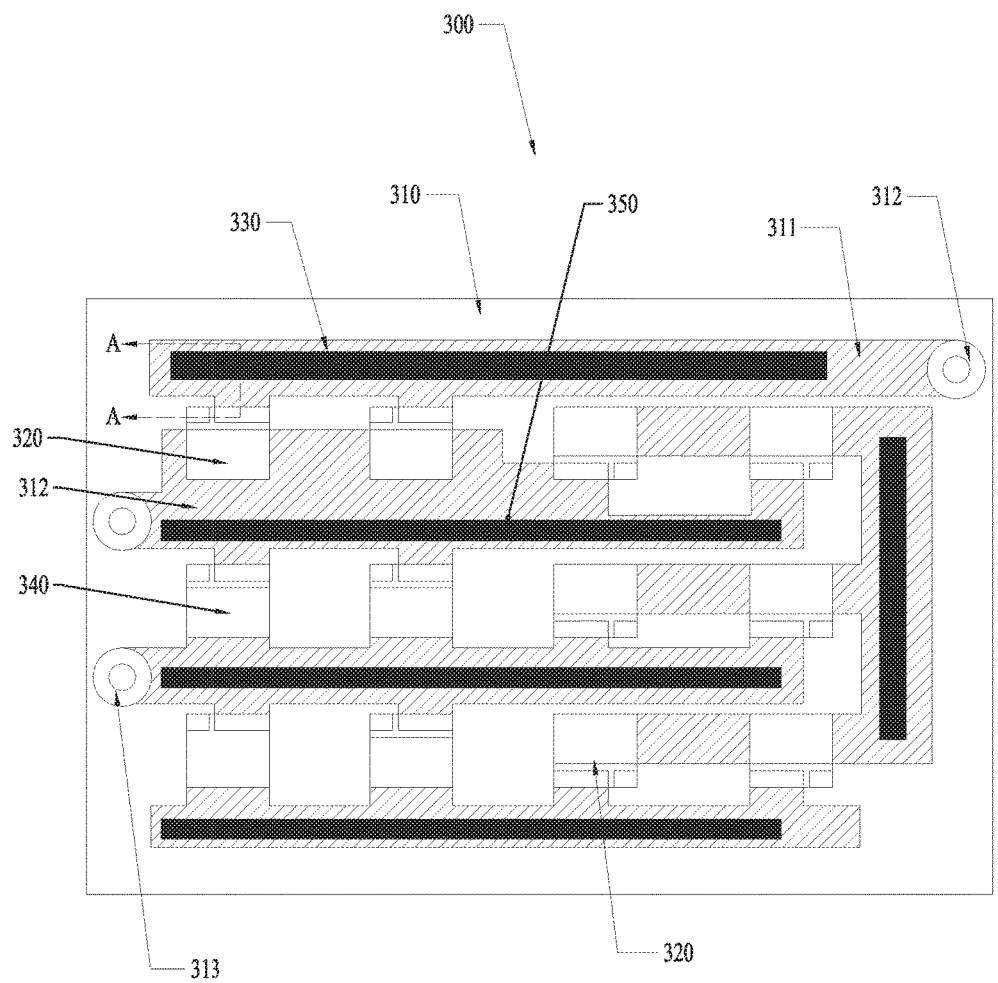
FIG. 3 is a schematic view of the printed circuit board assembly as shown in FIG. 2 with conductors.

As shown in FIG. 3, the conductor 330 is attached to the conductive portion 311 and electrically connects to the conductive portion 311. Because the current has an additional passage which is provided by the conductor 330, when current is flowing though the conductive portion 311, the heat generated by the conductive portion 311 is decreased relative to the condition without the conductor 330 as shown in FIG. 2.

Specifically, the conductor 330 is a metal bar or a metal strap and the size of the conductor 330 in a direction which is perpendicular to the length direction of the conductor 330 is in a range of about 0.5 mm to 2.5 mm.

The conductor may be a cylinder, and the radius of the cylinder is in a range of about 0.5 mm to 2.5 mm.

As shown in FIG. 3, the number of the semiconductor power devices is equal to or greater than 2 and the semiconductor power devices are arranged in a line which is parallel to the length direction of the conductor.

Specifically, the semiconductor power device 320 comprises a first connect pin 321 connecting to one conductive portion 311 which is electrically connected to one conductor 330; a second connect pin 322 connecting to another conductive portion 312 which is electrically connected to another conductor 350; and a control pin 323 for controlling the electrical connection between the first connect pin 321 and the second connect pin 322.

The conductive portions which are connected to the pins of the semiconductor power device and which perform the function as the first connect pin 321 or second connect pin 322 are connected with the conductors.

The semiconductor power device 320 may be a field-effect transistor such as a MOSFET or IGBT.

Figure 4:
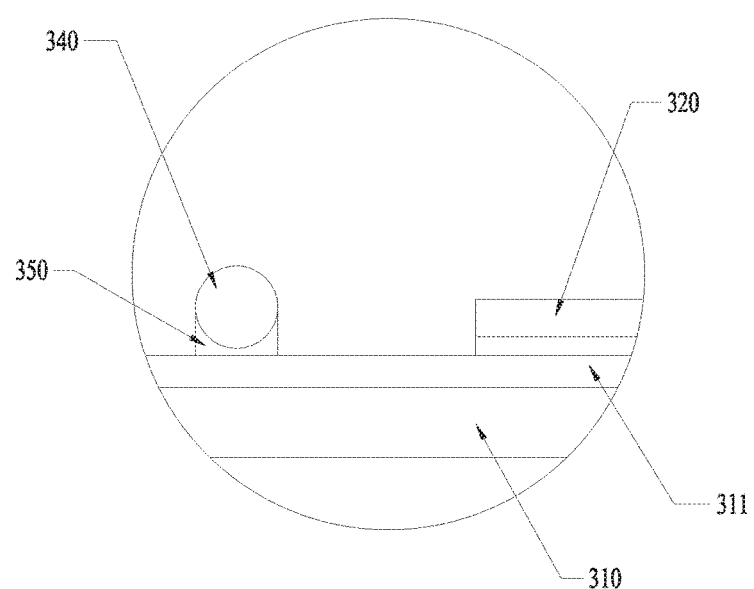
FIG. 4 is a schematic view of A-A section as shown in FIG. 3.

As shown in FIG. 4, the printed circuit board assembly 300 further has an interstitial substance 350 between the conductive portion 311 and the conductor 330.

The interstitial substance 350 is used to connect the conductive portion 311 with the conductor 330. The interstitial substance 350 is formed by a welding flux which consists of tin.

The above illustrates and describes basic principles, main features and advantages of the present invention. Those skilled in the art should appreciate that the above embodiments do not limit the present invention in any form. Technical solutions obtained by equivalent substitution or equivalent variations all fall within the scope of the present invention.

What is claimed is:

1. A printed circuit board assembly, comprising:
a main board having at least two conductive portions and an insulation portion all of which are exposed to a surface of the main board;
at least one semiconductor power device mounted on the main board; and
at least two conductors, each attached to a respective one of the conductive portions;
wherein the conductive portions electrically connect to the semiconductor power device, and the conductors electrically connect to the conductive portions,
and wherein the at least one semiconductor power device comprises:
a first connect pin connecting to a first one of the conductive portions which is electrically connected to a first one of the conductors;
a second connect pin connecting to second one of the conductive portions which is electrically connected to a second one of the conductors; and
a control pin for controlling the electrical connection between the first connect pin and the second connect pin.

2. The printed circuit board assembly of claim 1, further comprising an interstitial substance for connecting the conductive portions and the conductors wherein the interstitial substance is disposed between the conductive portions and the conductors.

3. The printed circuit board assembly of claim 1, wherein a number of semiconductor power devices is at least two semiconductor power devices.

4. The printed circuit board assembly of claim 3, wherein the at least two semiconductor power devices are arranged in a line which is parallel to the length direction of at least one of the conductors.

5. The printed circuit board assembly of claim 1, wherein the semiconductor power device is a field-effect transistor.

6. The printed circuit board assembly of claim 1, wherein each of the conductors is at least one of a metal strap or a metal bar.

7. A power tool, comprising:
an electric motor;
a power source for providing an electrical energy to the electric motor; and
a printed circuit board assembly having:
a main board having at least two conductive portions;
at least one semiconductor power device mounted on the main board; and
a conductor attached to each of the conductive portions;
wherein the conductive portions electrically connect to the semiconductor power device, and the conductors electrically connect to the conductive portions, and
wherein the at least one semiconductor power device comprises:
a first connect pin connecting to a first one of the conductive portions which is electrically connected to a first one of the conductors;
a second connect pin connecting to second one of the conductive portions which is electrically connected to a second one of the conductors; and
a control pin for controlling the electrical connection between the first connect pin and the second connect pin.

8. The power tool of claim 7, wherein the conductive portions and the semiconductor power device constitute a supply circuit between the electric motor and the power source.

9. The power tool of claim 7, wherein the printed circuit board assembly further comprises an interstitial substance for connecting the conductive portions and the conductors and wherein the interstitial substance is disposed between the respective conductive portion and the conductor.

10. The power tool of claim 7, wherein a number of semiconductor power devices is at least two semiconductor power devices.

11. The power tool of claim 10, wherein the at least two semiconductor power device are arranged in a line which is parallel to the length direction of at least one of the conductors.

12. The power tool of claim 7, wherein the semiconductor power device is a field-effect transistor.

13. The power tool of claim 7, wherein the semiconductor power device is a MOSFET.

14. The power tool of claim 7, wherein the semiconductor power device is an IGBT.

15. The power tool of claim 7, wherein the electric motor is a brushless motor, and the power source is a rechargeable battery pack.

16. The power tool of claim 7, wherein each of the conductors is at least one of a metal strap or a metal bar.

* * * * *